United States Patent [19]

Nakatsuka et al.

[11] Patent Number: 5,308,684
[45] Date of Patent: May 3, 1994

[54] BURNING PATTERN SHEET

[75] Inventors: Hiroshi Nakatsuka; Yozo Oishi; Kazuhiro Tajiri; Takafumi Sakuramoto; Takashi Tominaga; Megumi Ashida, all of Osaka, Japan

[73] Assignee: Nitto Denko Corporation, Osaka, Japan

[21] Appl. No.: 5,161

[22] Filed: Jan. 15, 1993

Related U.S. Application Data

[63] Continuation of Ser. No. 433,861, Nov. 9, 1989, abandoned.

[30] Foreign Application Priority Data

Nov. 11, 1988 [JP] Japan .................. 63-285204
Jan. 31, 1989 [JP] Japan .................. 1-21809

[51] Int. Cl.$^5$ .............................................. B32B 9/00
[52] U.S. Cl. .................................... 428/202; 428/352; 156/89; 156/230; 156/232; 156/234; 156/238; 156/239; 156/240; 156/247; 156/249
[58] Field of Search ............... 156/89, 155, 230, 232, 156/234, 238, 239, 240, 247, 249; 428/202, 328, 329, 352

[56] References Cited

U.S. PATENT DOCUMENTS

| | | | |
|---|---|---|---|
| 391,036 | 10/1888 | Ehrlich et al. | 156/155 |
| 493,449 | 3/1893 | Schmalz | 156/155 |
| 1,168,882 | 1/1916 | Hasburg | 156/155 |
| 1,283,606 | 11/1918 | Warga | 156/89 |
| 1,287,793 | 12/1918 | Tillyer et al. | 156/155 |
| 1,996,549 | 4/1935 | McNutt | 156/155 |
| 2,190,210 | 2/1940 | Kaber | 156/89 |
| 2,502,758 | 4/1950 | Short | 156/89 |
| 2,629,670 | 2/1953 | Rathke | 156/155 |
| 2,970,076 | 1/1961 | Porth | 156/89 |
| 3,007,829 | 11/1961 | Akkeron | 156/89 |
| 3,615,980 | 10/1971 | Schuck | 156/240 |
| 3,847,725 | 11/1974 | Hochner | 428/354 |
| 3,974,311 | 8/1976 | Cherrin | 428/354 |
| 4,304,808 | 12/1981 | Priest | 156/240 |
| 4,322,467 | 3/1982 | Heimbach et al. | 428/328 |
| 4,421,816 | 12/1983 | Arnold | 428/354 |

FOREIGN PATENT DOCUMENTS 1376003 12/1974 United Kingdom.

Primary Examiner—Caleb Weston
Attorney, Agent, or Firm—Sughrue, Mion, Zinn, Macpeak & Seas

[57] ABSTRACT

A process of forming burned patterns and a burning pattern sheet for use in the process are disclosed, the process comprising forming patterns composed of a burning ink on one surface of a tacky member composed of a flexible base material and an adhesive layer or between both the layers, adhering the tacky member to an article through the adhesive layer, and burning the assembly to form a burned pattern product fixed to the surface of the article.

7 Claims, 1 Drawing Sheet ns. 5,308,684

BURNING PATTERN SHEET

This is a continuation of application Ser. No. 07/433,861, filed Nov. 9, 1989, abandoned.

FIELD OF THE INVENTION

The present invention relates to a process of forming heat-resisting identification patterns by adhering a tacky pattern sheet, which comprises a flexible base material and an adhesive layer having patterns of a burning ink formed on the surface of the adhesive layer, or on the surface of the base material, or between both the layers, to a desired material or article followed by subjecting the assembly to a burning treatment. The present invention also relates to a burning pattern sheet for use in the process.

BACKGROUND OF THE INVENTION

While production systems are changing into systems of producing many kinds but small amount of products, an identification, which is used for the management of products, semi-products, parts, etc., composed of metals, glass, or burned ceramics, etc., has been required to be excellent in heat resistance and durability and capable of being easily and directly adhered to even a curved surface of a desired article.

Hitherto, as an identification which is excellent in heat resistance and durability and can be directly fixed to an article, there is known a plate type identification composed of a metal, a porcelain enamel, or a burned ceramic. However, in the conventional identification, there are various problems that screwing is required for fixing the identification plate, which makes the fixing procedure troublesome, fixing of the identification plate to a curved surface of an article is difficult due to the poorness in flexibility, and it is difficult to make labels by forming patters in place as occasion may demand.

On the other hand, it is known a process of forming burned patterns by directly coating a pasty ink composed of glass powder, pigment(s), etc., with a binder on an article by a screen printing system, etc., or by once coating the ink on a transfer paper and transferring the coated patterns onto an article, followed by burning the coated patterns. However, in this process, there are problems that coating of the pasty ink on a curved surface is difficult, the amounts of screens, etc., being previously prepared in a system of producing many kinds but small amounts of products become huge, and also a long time and a great deal of work are required in the preparation of them. In addition to the aforesaid problems, in the case of transferring the pattern from a transfer paper to an article, there is a problem that the patterns transferred to the article are liable to fall off.

SUMMARY OF THE INVENTION

It has now been discovered that the aforementioned problems can be solved by forming patterns of a burning ink on a member composed of a flexible base material and an adhesive layer at the surface of the adhesive layer, or at the surface of the base material, or between both the layers, adhering the member to an article through the adhesive layer, and burning the assembly to fix the burned patterns to the article.

That is, according to the present invention, there is provided a process of forming burned patterns, which comprises forming patterns comprising a burning ink on one surface of a tacky member comprising a flexible base material and an adhesive layer or between both the layers, adhering the tacky member to an article through the adhesive layer, and subjecting the assembly to a burning treatment to fix the burned pattern product onto the surface of the article.

DETAILED DESCRIPTION OF THE INVENTION

In the present invention, by employing the system of forming patterns composed of a burning ink on a tacky member composed of a flexible base material and an adhesive layer at the surface of the adhesive layer, or at the surface of the base material, or between both the layers, a burning pattern sheet capable of easily and simply adhering to a curved portion or the like of an article can be obtained. Also, such pattern sheets can be easily prepared in place as occasion may demand.

Furthermore, by adhering the burning pattern sheet to an article through the adhesive layer followed by burning, the burning ink applied to the adhesive layer as the patterns is automatically fixed to the article in the form of the patterns while being burned so as to form a burned pattern product having excellent heat resistance and durability on the article.

Figure 1:
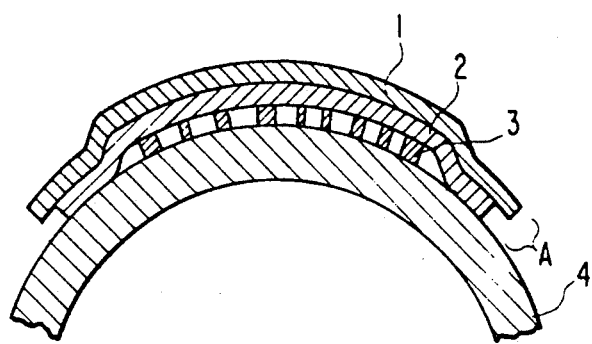
FIG. 1 is a cross sectional view showing an example of the burning pattern sheet for use in the present invention and FIG. 2 is a front view of an example of the burned pattern formed by the process of the present invention.

An example of the burning pattern sheet for use in the process of the present invention in which a tacky member is composed of a flexible base material and an adhesive layer having patterns composed of a burning ink formed on the adhesive layer is described below referring to FIG. 1. FIG. 1 shows a state of adhering the tacky member A on the surface of an article 4, the tacky member A being composed of a flexible base material 1 and an adhesive layer 2 having formed on the adhesive layer a pattern 3 of a burning ink.

The flexible base material 1 may comprise a combustible base material or a separator each having flexibility.

The combustible base material is burned out at burning. Examples of such a material include films of a hydrocarbon resin, a vinyl or styrene resin, an acetal resin, a butyral resin, an acrylic resin, a polyester resin, a urethane resin, a cellulose resin, etc.; woven cloths; nonwoven cloths; and papers. The combustible base material which can easily be burned out at burning is preferably used in this invention. In this point of view, a hydrocarbon resin, an acetal resin, an acrylic resin, and a cellulose resin are preferred and an acrylic resin is particularly preferred.

The thickness of the combustible base material may be suitably selected but is generally from 5 μm to 500 μm, and preferably from 30 to 200 μm. If the thickness thereof is too thick, burning troubles such as the occurrence of a poor appearance of the burned product, etc., occur as the case may be.

As the separator which is also used as the flexible base material in the present invention, a material which can be easily separated from the adhesive layer 2 by being treated with a releasing agent, etc., is used. Since the separator is separated from the adhesive layer before burning after applying the burning pattern sheet to an article, the separator is not required to be combustible different from the aforesaid combustible base material and there is no particular restriction on the material.

The adhesive layer 2 is formed in such a manner that the layer is burned out by causing thermal decomposition or the like at a temperature below the burning temperature. The adhesive being used for forming the adhesive layer may have an adhesive force capable of temporarily adhere the burning pattern sheet to an article in addition to the aforesaid burning out property. As the adhesive which is preferably used in this invention from such a point, there are rubber adhesives, acrylic adhesives, vinyl alkyl ether adhesives.

In these adhesives, rubber series adhesives such as natural rubber, synthetic rubber of a same series as the natural rubber, and polymers, e.g., butyrene rubber, polyisoprene rubber, styrene-butadiene rubber, styrene-isoprene-styrene block copolymer rubber, or styrene-butadiene-styrene block copolymer rubber; rubber series adhesives composed of 100 parts by weight of the aforesaid polymer, from 10 to 300 parts by weight of an adhesion imparting resin such as a petroleum resin, a terpene resin, a rosin, resin, a xylene resin, a coumarone-indene resin, etc., and optionally other additives such as a softening agent, an aging inhibitor, a coloring agent, a filler, etc.; and acrylic adhesives mainly composed of a polymer of an alkyl ester of acrylic acid or methacrylic acid are preferred.

The adhesive layer 2 can be formed on the flexible base material 1 by a method of producing an adhesive tape such as a system of coating the adhesive on the base material using a coater, or a system of transferring an adhesive layer formed on a separator onto the base material. The thickness of the adhesive layer can be properly determined according to the using purpose but is generally from 1 μm to 500 μm, and preferably from 3 to 100 μm.

In this embodiment, the pattern 3 is formed on the adhesive layer 2 using a burning ink. The system of forming the pattern on the adhesive layer is advantageous in view of stably holding the pattern before the application of the burning treatment.

The burning ink being used may be an ink capable of automatically fixing the burned product formed by the burning treatment on the article. Such a property can be imparted by using a material which is melted or reacted at a temperature below the burning temperature and remains at burning without being burned out. When the material is melt-fixed, a fix imparting agent may be used. Typical examples of the fix imparting agent include ceramic powders such as a glass powder, a powder capable of forming glass upon burning, a powder of a metal or an alloy which is used for the formation of solder, and a powder of a metal or an alloy which is used as a sintering material in powder metallurgy.

The fix imparting agent may be properly selected according to the burning temperature based on the heat resistance, etc., of the article being used and the purpose of the burning pattern sheet. For example, in the case of a glass powder, a lead glass powder is used when the burning temperature is from 400° C. to 600° C., a lead silicate glass powder or a soda glass powder is used when the burning temperature if from 500° C. to 1,000° C., and a silicate glass powder or a quartz glass powder is used when the burning temperature is higher than 900° C., in particular from 1,000° C. to 1,200° C.

The burning ink is generally prepared by mixing at least one kind of the aforesaid fix imparting agent and a binder together with, if necessary, other component(s) remaining after burning by a ball mill. The present invention includes a case where the ink component is adhered on the article by means of the adhesive force of the adhesive layer and in such a case, the binder is, as the case may be, not used. In the case of mixing the components for the burning ink described above, a system of preparing a fluid mixture such as a pasty mixture, etc., using a solvent and, if necessary, proper additives such as a plasticizer and a dispersing agent is generally employed. The present invention is not, as a matter of course, limited to such a system and a proper mixing system may be used according to the system of forming patterns. For example, the burning ink can be also used as a powder or a molten liquid as a case of forming patterns by spreading the aforesaid mixture as a powdery state or a case of forming patterns using the aforesaid mixture under molten state by heating, respectively.

The composition of the burning ink may be properly selected. In general, the burning ink composition is composed of from 0 to 100% by weight, and preferably from 10 to 95% by weight the fix imparting agent and from 100 to 0% by weight, and preferably from 90 to 5% by weight other burning remaining component(s). When a binder is used, the proportion thereof is from 5 to 50% by weight of the total burning remaining components.

As the burning remaining components other than the fix imparting agent, the powders or fibers of inorganic materials such as ceramics, metals, alloys, and oxides of the metals can generally be used. The burning ink composition for use in the present invention can be imparted with an electric conductivity by using a metal powder or an alloy powder.

When a good contract with an article being applied with the burning ink is desired, a colored glass powder or a coloring agent is, if necessary, used for the ink composition. As the coloring agent, inorganic pigments or fillers are generally used without particular restriction on the kind thereof.

Examples of the pigment or filler include white substances such as silica, calcium carbonate, titanium oxide, zinc white, zirconia, calcium oxide, alumina, and other metal compounds such as carbonates, nitrates, sulfates, etc., which are converted into such white oxides by being oxidized at a temperature below the burning temperature; red substances such as manganese oxide-alumina, chromium oxide-tin oxide, iron oxide, cadmium sulfide-selenium sulfide, etc., containing metal ions such as iron ions, copper ions, gold ions, chromium ions, selenium ions, etc.; blue substances such as cobalt oxide, zirconia-vanadium oxide, chromium oxide-divanadium pentaoxide, etc., containing metal ions such as manganese ions, cobalt ions, copper ions, iron ions, etc.; and black substances such as chromium oxide-cobalt oxide-iron oxide-manganese oxide, etc., containing metal ions iron ions, copper ions, manganese ions, chromium ions, cobalt ions, etc.

As the binder which is used for preparing the burning ink, a wax or a resin, which is burned out by being thermally decomposed at a temperature below the burning temperature is used. Examples of the preferred wax include paraffin waxes, natural waxes, ester waxes, higher alcohol waxes, and higher amide waxes. As the resin, the combustible resins illustrated hereinbefore as the materials for the combustible base materials can be used. When the aforementioned flexible base material is a combustible base material, if the properties of the combustible base material, such as thermal decomposition temperature, etc., are greatly different from the properties of the binder, a poor appearance by, for example, foams, deformation, etc., is liable to occur in the burned product. From such a view point, it is preferred that the binder is composed of the same resin as the combustible base material.

The pattern of the burning ink can be formed on the adhesive layer 2 by any system such as a handwriting system, a coating system through a pattern forming mask, a system of transferring patterns from a transfer paper having formed thereon the patterns, and a system of forming the pattern by a printer such as an ink jet printer. The shape of the patterns being formed may be optional. That is, any desired patterns such as picture-like patterns, bar code patterns, circuit patterns, etc., may be formed.

An ink sheet such as a print ribbon, which is required in the case of forming patterns by a printer such as an X-Y plotter, a wire-dot printer, a heat-transfer type printer, an impact type printer, etc., can be prepared by coating the burning ink on a support composed of a film or a cloth by a coating system, an impregnating system, etc. As the support in this case, films of a plastic such as polyester, polyimide, a fluorine resin, etc., or cloths composed of fibers of nylon, polyester, etc., can be used.

The pattern forming system by a printer has an advantage that a proper pattern can be efficiently formed with a good accuracy. When it is not easy to form patterns directly on the adhesive layer due to the adhesiveness thereof in the case of forming the pattern by a printer, a transfer system may be used together. From such a view point, the transfer paper treated with a releasing agent so that the paper is easily peeled off after transferring the pattern onto the adhesive layer is preferably used.

The adhesive layer formed thereon the patterns is, if necessary, protected by covering with a separator until the pattern sheet is adhered to an article. In the case of the transfer system, the transfer paper is left as it is for use as the aforesaid separator.

The thickness of the patterns of the burning ink is generally from 0.5 to 100 μm, and preferably from 3 to 20 μm.

As described above, the patterns of the burning ink may be formed on the surface of the adhesive layer 2, but when the flexible base material 1 is composed of a combustible base material, the patterns may be formed on the surface of the flexible base plate 1. Also, the patterns of the burning ink may be formed between the flexible base material 1 and the adhesive layer 2 (in the present invention, it referred to as "between both the layers"). In the case of forming the patterns between both the layers, the patterns are formed on the surface of the flexible base material 1 or the surface of the adhesive layer 2 and the two components are then stuck to each other with the patterns between them.

The burning pattern sheet for use in the present invention can be used in a proper form such as the patterns composed of successively arranged pattern units, a labelled pattern formed by plural pattern units, etc. The pattern composed of successively arranged pattern unit can be preferably applied to a long article which is cut after the burning treatment or successively arranged articles. Also, the aforesaid pattern sheet can be also utilized as a label mother material being subjected to punching or cutting before use since patterns can be efficiently applied and the pattern sheet is useful for the formation of uniform labels.

Furthermore, the formation of the patterns on the surface of the adhesive layer or the surface of the base material, or between both the layers may be previously performed as described above, but the patterns may be formed in place in a working line, etc., to form a burning pattern sheet and the pattern sheet may be adhered to the surface of each desired article.

The burned pattern forming process of the present invention can be preferably used for picture formations on articles such as pottery articles, glass articles, enamel articles, etc., and also the formation of identification patterns or circuit patterns on articles. Also, the process of the present invention is preferably used for the formation of identification symbols or codes, such as company names, lot numbers, names of products, names of customers, exporting countries, etc., on articles composed of glass, ceramics, metals, etc., or on conveyer pallets, in particular heat-resisting bases or trial works, etc., or the formation of identification patterns composed of colored or color-discriminating patterns, bar codes, etc.

When the pattern formed on an article is required to have a contrast with the article as the case of an identification pattern and also a sufficient contrast is not obtained, the article may be pre-treated to have a color different from the color of the burned pattern product. The pre-treating agent may generally be a mixture of almost the same components as those for the burning ink composition described above (the binder may be omitted), but in this case, the components of the pre-treating agent are required to be selected such that the components thereof remaining after burning show a clear contrast with the burned pattern product on the article after burning.

The aforesaid pre-treatment can be performed by applying the aforesaid mixture using a printing means, applying the mixture on the surface of the article using a brush, etc., or forming a film or a sheet of the mixture and laminating the film or the sheet on the article using a means such as hot-press and an adhesive.

The burned pattern product can be formed by adhering the tacky member (burning pattern sheet) previously prepared or prepared in place (such as a working line) to an article through the adhesive layer and burning the assembly thus formed. In this case, when the flexible base material of the burning pattern sheet is composed of a separator, the separator is peeled off before subjecting the assembly to the burning treatment. The burning treatment is performed under a proper heating condition according to the nature of the fix imparting agent, etc., used. The burning temperature is generally 350° C. or more, and preferably from 370° to 1,600° C.

Figure 2:
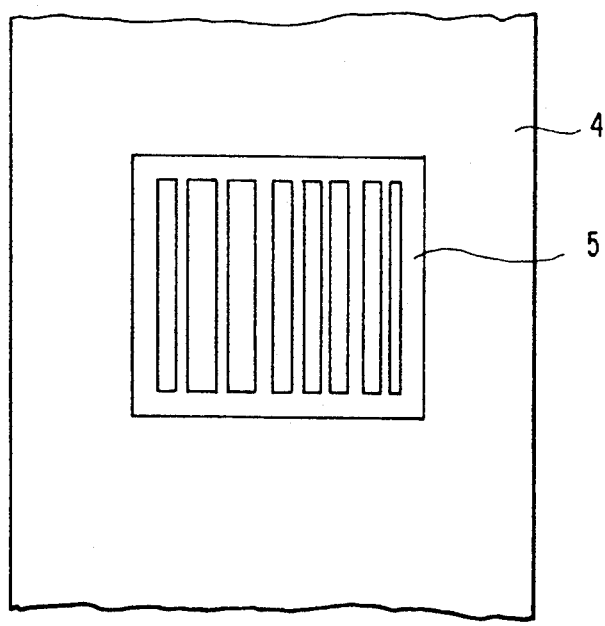

By the burning treatment, the adhesive layer, etc., are burned out and the burning remaining components of the burning ink remain as the burned product while keeping the pattern and finally fixed to the article 4 as the burned pattern product 5 as shown in FIG. 2.

In addition, when the article is composed of unburned ceramic, burning of the burning pattern sheet, burning or other necessary heat-treatment of the ceramic article may be performed simultaneously.

Since in the present invention, the burning pattern sheet is prepared by forming patterns of the burning ink on the surface of the adhesive sheet or the surface of the flexible base material, or between both the layers, the pattern sheet is excellent in retentivity and is reluctant to cause damages of the patterns at cutting thereof or at adhering the sheet to articles. Furthermore, desired patterns can be easily and expediently applied to articles and identification patterns or picture patterns in a system of producing many kinds but small amounts of products can be easily formed. Moreover, since in the process of the present invention, the burning pattern sheet is adhered to an article through the adhesive layer, the patterns are reluctant to fall off from the article and also the pattern sheet can be easily adhered to a curved surface owing to the flexibility of the sheet. Furthermore, the burned patterns formed are excellent in durability and heat resistance.

Then, the present invention is further described referring to the following examples, but the present invention is not construed as being limited thereto.

EXAMPLE 1

An adhesive layer of 15 μm in thickness composed of an acrylic adhesive was formed on a polyisobutyl methacrylate film of 50 μm in thickness and a bar code pattern composed of a burning ink was formed thereon through a pattern mask by printing followed by drying to provide a burning pattern sheet. The burning ink used above was a pasty ink prepared by mixing 20 parts by weight of a lead silicate glass powder, 20 parts by weight of a chromium oxide-iron oxide-cobalt oxide black pigment, 20 parts by weight of polyisobutyl methacrylate, and 80 parts by weight of toluene.

Then, the burning pattern sheet was adhered to an alumina base through the adhesive layer and was burned in the atmosphere for 30 minutes at 500° C. The organic components such as polyisobutyl methacrylate and the acrylic adhesive were burned out by the burning treatment.

By the aforesaid treatment, a burned pattern of a black and sharp bar code strongly fixed to the alumina base was obtained.

EXAMPLE 2

After forming the adhesive layer and a bar code pattern composed of the burning ink by following the same procedure as Example 1 except that a separator of 50 μm in thickness composed of a polyester film treated with a releasing agent in place of the polyisobutyl methacrylate film, the burning pattern sheet thus prepared was adhered to a glass plate. After removing the separator, the assembly was burned in the atmosphere for 30 minutes at 500° C. The organic components such as the acrylic adhesive, etc., were burned out by the burning treatment.

By the aforesaid procedure, a burned pattern of a black and sharp bar code strongly fixed onto the glass plate was obtained.

EXAMPLE 3

A bar code pattern composed of a burning ink was formed on a transfer paper composed of a polyester film treated with a releasing agent through a pattern mask and dried to provide a transfer sheet. The burning ink used above was a pasty ink prepared by mixing 20 parts by weight of a powder of a tin-zinc(9%) alloy, 20 parts by weight of polyisobutyl methacrylate, and 60 parts by weight of toluene.

Then, the aforesaid transfer sheet was attached under pressure on an adhesive layer of 15 μm in thickness composed of an acrylic adhesive formed on a polyisobutyl methacrylate film of 50 μm in thickness through the pattern-forming surface and then the transfer paper (polyester film) was peeled off to transfer the bar code pattern onto the adhesive layer and to provide, thus, a burning pattern sheet.

Then, the aforesaid burning pattern sheet was adhered to a metal base through the adhesive layer and burned in the atmosphere for 30 minutes at 500° C. The organic components such as the polyisobutyl methacrylate and the acrylic adhesive were burned out by the burning treatment.

From the aforesaid procedure, a burned pattern composed of a white and sharp bar code strongly fixed onto the metal base plate was obtained.

EXAMPLE 4

A bar code pattern composed of a burning ink was printed through a pattern mask on one surface of a polyisobutyl methacrylate film of 50 μm in thickness provided acrylic adhesive on the other surface thereof and dried to provide a burning pattern sheet. The burning ink used was a pasty ink prepared by mixing 20 parts by weight of a lead borosilicate glass powder, 20 parts by weight of a chromium oxide-iron oxide-cobalt oxide black pigment, 20 parts by weight of polyisobutyl methacrylate, and 40 parts by weight of toluene.

Then, the aforesaid burning pattern sheet was adhered to an alumina base plate through the adhesive layer and burned in the atmosphere for 30 minutes at 500° C. The organic components such as polyisobutyl methacrylate and the acrylic adhesive were burned out by the burning treatment.

By the aforesaid procedure, a burned pattern composed of a black and sharp bar code strongly fixed to the alumina base plate was obtained.

While the invention has been described in detail and with reference to specific examples thereof, it will be apparent to one skilled in the art that various changes and modifications can be made therein without departing from the spirit and scope thereof.

What is claimed is:

1. A burning pattern sheet consisting essentially of a tacky member comprising a flexible base material and an adhesive layer, the flexible base material having a pattern comprising a burning ink formed on the surface of the flexible base material opposite to the adhesive layer, wherein the adhesive layer consists essentially of at least one adhesive selected from the group consisting of rubber adhesives, acrylic adhesives and vinyl alkyl ether adhesives.

2. A burning pattern sheet consisting essentially of a tacky member comprising a flexible base material and an adhesive layer, said tacky member having a pattern comprising a burning ink formed between said adhesive layer and said flexible base material, wherein said adhesive layer consists essentially of at least one adhesive selected from the group consisting of rubber adhesives, acrylic adhesives and vinyl alkyl ether adhesives.

3. A burning pattern sheet as claimed in claim 2, wherein the flexible base material is a combustible base material.

4. A burning pattern sheet as claimed in claim 2, wherein the flexible base material is a separator separable from the adhesive layer.

5. A burning pattern sheet to be fixed onto the surface of an article comprising a tacky member comprising a flexible base material and an adhesive layer, said tacky member having a pattern comprising a burning ink formed on the surface of said flexible base material, wherein said adhesive layer consists essentially of at least one adhesive selected from the group consisting of rubber adhesives, acrylic adhesives and vinyl alkyl ether adhesives which thermally decomposes at a temperature lower than a burning temperature at which said pattern fixes onto said surface.

6. A burning pattern sheet as claimed in claim 5, wherein the flexible base material is a combustible base material.

7. A burning pattern sheet as claimed in claim 5, wherein the flexible base material is a separator separable from the adhesive layer.

* * * * *